United States Patent
Del Puerto et al.

(10) Patent No.: US 10,001,713 B2
(45) Date of Patent: Jun. 19, 2018

(54) LITHOGRAPHIC APPARATUS AND METHOD

(71) Applicants: ASML Holding N.V., Veldhoven (NL); ASML Netherlands B.V., Veldhoven (NL)

(72) Inventors: Santiago E. Del Puerto, Milton, NY (US); Matthew Lipson, Stamford, CT (US); Kenneth C. Henderson, New York, NY (US); Raymond Wilhelmus Louis LaFarre, Helmond (NL); Louis John Markoya, Sandy Hook, CT (US); Tammo Uitterdijk, Wilton, CT (US); Johannes Petrus Martinus Bernardus Vermeulen, Helmond (NL); Antonius Franciscus Johannes De Groot, Someren (NL); Ronald Van Der Wilk, Knegsel (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 59 days.

(21) Appl. No.: 14/762,452

(22) PCT Filed: Feb. 5, 2014

(86) PCT No.: PCT/EP2014/052204
§ 371 (c)(1),
(2) Date: Jul. 21, 2015

(87) PCT Pub. No.: WO2014/122151
PCT Pub. Date: Aug. 14, 2014

(65) Prior Publication Data
US 2015/0370180 A1    Dec. 24, 2015

Related U.S. Application Data

(60) Provisional application No. 61/762,047, filed on Feb. 7, 2013.

(51) Int. Cl.
G03B 27/52    (2006.01)
G03F 7/20    (2006.01)
(Continued)

(52) U.S. Cl.
CPC ...... *G03F 7/70875* (2013.01); *G03F 7/70708* (2013.01); *H01L 21/67109* (2013.01); *H01L 21/6831* (2013.01); *H01L 21/6875* (2013.01)

(58) Field of Classification Search
CPC ............ G03F 7/70708; G03F 7/70875; G03F 7/70808; G03F 7/70841; G03F 7/70858;
(Continued)

(56) References Cited

U.S. PATENT DOCUMENTS 4,766,670 A * 8/1988 Gazdik ............... H01L 23/5387
257/E23.177
5,220,171 A    6/1993 Hara et al.
(Continued)

FOREIGN PATENT DOCUMENTS

DE    10 2009 021 330 A1    12/2009
EP    1 840 657 A1    10/2007
(Continued)

OTHER PUBLICATIONS

English-Language Abstract for German Patent Publication No. 10 2009 021 330 A1, published Dec. 21, 2009; 1 page.
(Continued)

*Primary Examiner* — Christina Riddle
(74) *Attorney, Agent, or Firm* — Sterne, Kessler, Goldstein & Fox P.L.L.C.

(57) ABSTRACT

A support such as a clamp (310) is configured to releasably hold a patterning device such as a reticle (300) to secure it and prevent heat-induced deformation of it. For example, an electrostatic clamp includes a first substrate (312) having opposing first (313) and second (315) surfaces, a plurality of (Continued)

burls (316) located on the first surface and configured to contact the reticle, a second substrate (314) having opposing first (317) and second (319) surfaces. The first surface of the second substrate is coupled to the second surface of the first substrate. A plurality of cooling elements (318) are located between the first surface of the second substrate and the second surface of the first substrate. The cooling elements are configured to cause electrons to travel from the second surface of the first substrate to the first surface of the second substrate. Each cooling element is substantially aligned with a respective burl.

15 Claims, 18 Drawing Sheets

(51) Int. Cl.
*H01L 21/67* (2006.01)
*H01L 21/683* (2006.01)
*H01L 21/687* (2006.01)

(58) Field of Classification Search
CPC .............. G03F 7/70866; G03F 7/7095; H01L 21/6831; H01L 21/6833; H01L 21/6875
USPC ......... 355/30, 52, 53, 55, 67–71, 72, 75–77; 250/492.1, 492.2, 492.22, 493.1, 548, 250/503.1; 430/5
See application file for complete search history.

(56) References Cited

U.S. PATENT DOCUMENTS

| | | | |
|---|---|---|---|
| 6,084,938 A | | 7/2000 | Hara et al. |
| 6,098,408 A | * | 8/2000 | Levinson ................ F25B 21/02 62/3.2 |
| 2005/0099758 A1 | * | 5/2005 | Kellerman .......... H01L 21/6833 361/234 |
| 2005/0132750 A1 | | 6/2005 | Elp |
| 2006/0033898 A1 | * | 2/2006 | Cadee ................ G03F 7/70341 355/53 |
| 2007/0285647 A1 | * | 12/2007 | Kwan ..................... G03F 7/707 355/72 |
| 2008/0151004 A1 | * | 6/2008 | Yamamoto ............. B41J 2/1408 347/50 |
| 2009/0031733 A1 | * | 2/2009 | Weaver, Jr. ............. F25B 21/00 62/3.6 |
| 2010/0163090 A1 | * | 7/2010 | Liu ..................... H01L 23/3675 136/224 |
| 2012/0274920 A1 | * | 11/2012 | Bex ..................... G03F 7/70708 355/72 |
| 2012/0299253 A1 | * | 11/2012 | Kosakai ............ H01L 21/67103 279/128 |
| 2012/0304483 A1 | * | 12/2012 | Sirard ............... H01L 21/02057 34/289 |

FOREIGN PATENT DOCUMENTS

| | | |
|---|---|---|
| EP | 2 392 552 A1 | 12/2011 |
| JP | 05-021308 A | 1/1993 |
| WO | WO 2009/032197 A | 3/2009 |

OTHER PUBLICATIONS

International Search Report directed to related International Patent Application No. PCT/EP2014/052204, dated Oct. 1, 2014; 7 pages.
International Preliminary Report on Patentability and Written Opinion of the International Searching Authority directed to related International Patent Application No. PCT/EP2014/052204, dated Aug. 11, 2015; 12 pages.

* cited by examiner

LITHOGRAPHIC APPARATUS AND METHOD

CROSS-REFERENCE TO RELATED APPLICATIONS

This application claims the benefit of U.S. provisional application 61/762,047, which was filed on 7 Feb. 2013, and which is incorporated herein in its entirety by reference.

FIELD

The present disclosure relates to a lithographic apparatus and a method, and in particular to portions of a lithographic apparatus that support a patterning device.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Another known method of producing EUV radiation is known as dual laser pulsing (DLP). In the DLP method droplets are pre-heated by a Nd:YAG laser to cause the droplet (e.g., a tin droplet) to decompose into vapour and small particles that are then heated to a very high temperature by a $CO_2$ laser.

The radiation generated by such sources will not, however, be only EUV radiation and the source may also emit at other wavelengths including infra-red (IR) radiation and deep ultra-violet (DUV) radiation. DUV radiation can be detrimental to the lithography system as it can result in a loss of contrast. Furthermore unwanted IR radiation can cause heat damage to components within the system. It is therefore known to use a spectral purity filter to increase the proportion of EUV in the transmitted radiation and to reduce or even eliminate unwanted non-EUV radiation such as DUV and IR radiation.

When radiation strikes a reticle or a mask, the reticle or mask can be deformed because of heat absorbed from the radiation. This deformation can be especially problematic when the radiation is EUV radiation, which has relatively high energy. To reduce the deformation, a coolant can be circulated through devices used to secure the reticle or the mask to the rest of the lithographic apparatus (e.g., a chuck and/or a clamp). This coolant, however, may leak through cracks in the device. Moreover, such a coolant-based cooling system may be dependent on the thermal conductive properties of the device, which may be poor.

SUMMARY

Therefore, what is needed is a device that can secure a reticle and prevent heat-induced deformation of a patterning device. According to a first an aspect of the invention there is provided a lithographic apparatus. The lithographic apparatus includes a reticle and an electrostatic clamp configured to releasably hold the reticle. The electrostatic clamp includes a first substrate having opposing first and second surfaces, a plurality of burls located on the first surface and configured to contact the reticle, a second substrate having opposing first and second surfaces. The first surface of the second substrate is coupled to the second surface of the first substrate. A plurality of cooling elements are located between the first surface of the second substrate and the second surface of the first substrate. The cooling elements are configured to cause electrons to travel from the second surface of the first substrate to the first surface of the second substrate. Each cooling element is substantially aligned with a respective burl.

According to a second aspect, an electrostatic clamp is provided. The electrostatic clamp includes a first substrate having opposing first and second surfaces, a plurality of burls located on the first surface and configured to contact a reticle, a second substrate having opposing first and second surfaces, the first surface of the second substrate being coupled to the second surface of the first substrate, and a plurality of cooling elements located between the first surface of the second substrate and the second surface of the first substrate. The cooling elements are configured to conduct electrons from the second surface of the first substrate to the first surface of the second substrate. Each of the plurality of the cooling elements is substantially aligned with a respective burl.

According to a third aspect, a method is provided. The method includes forming a clamp out of cordierite, the clamp having opposing first and second surfaces, the first surface being configured to be coupled to an object,
providing an intermediate layer on the second surface of the clamp, and coupling the clamp to a chuck. The intermediate layer enhances the adhesion between the clamp and the chuck.

According to a fourth aspect, an apparatus is provided. The apparatus includes a chuck,
a clamp configured to releasably hold a reticle, the clamp being formed out of cordierite; and an intermediate layer coupled to a surface of the clamp and coupled to the chuck.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus.

Figure 1:
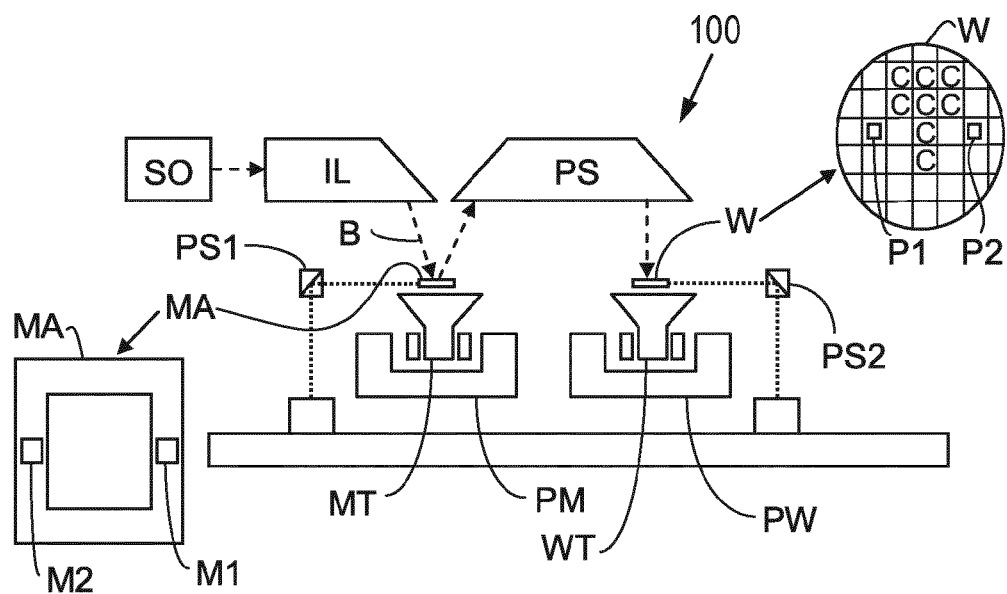

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically shows a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
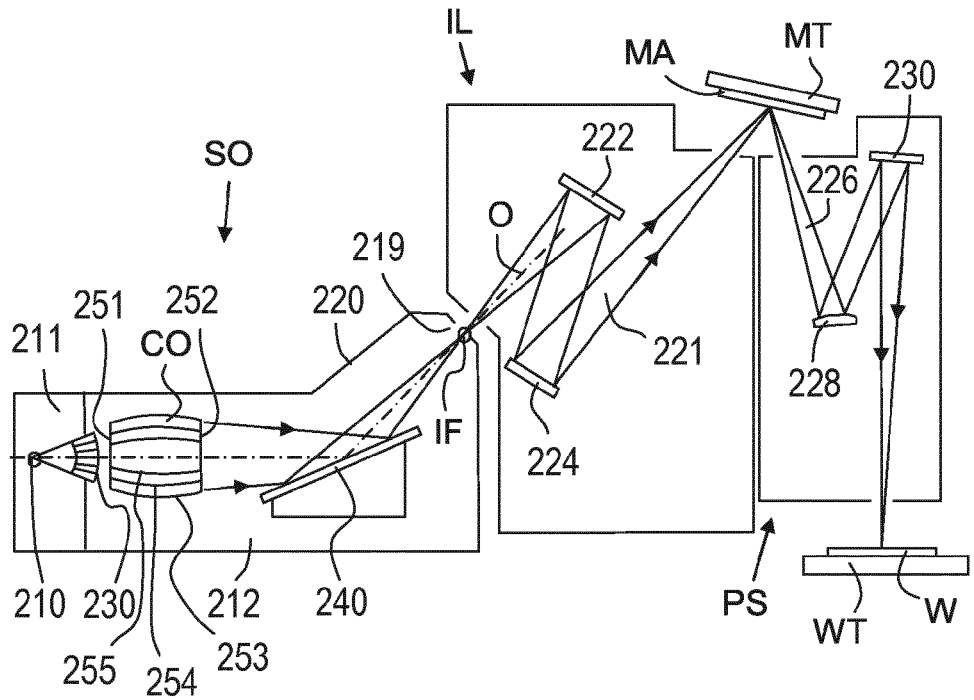
FIG. 2 is a more detailed schematic view of the lithographic apparatus.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Methods and Systems for Cooling a Reticle

Figure 3:
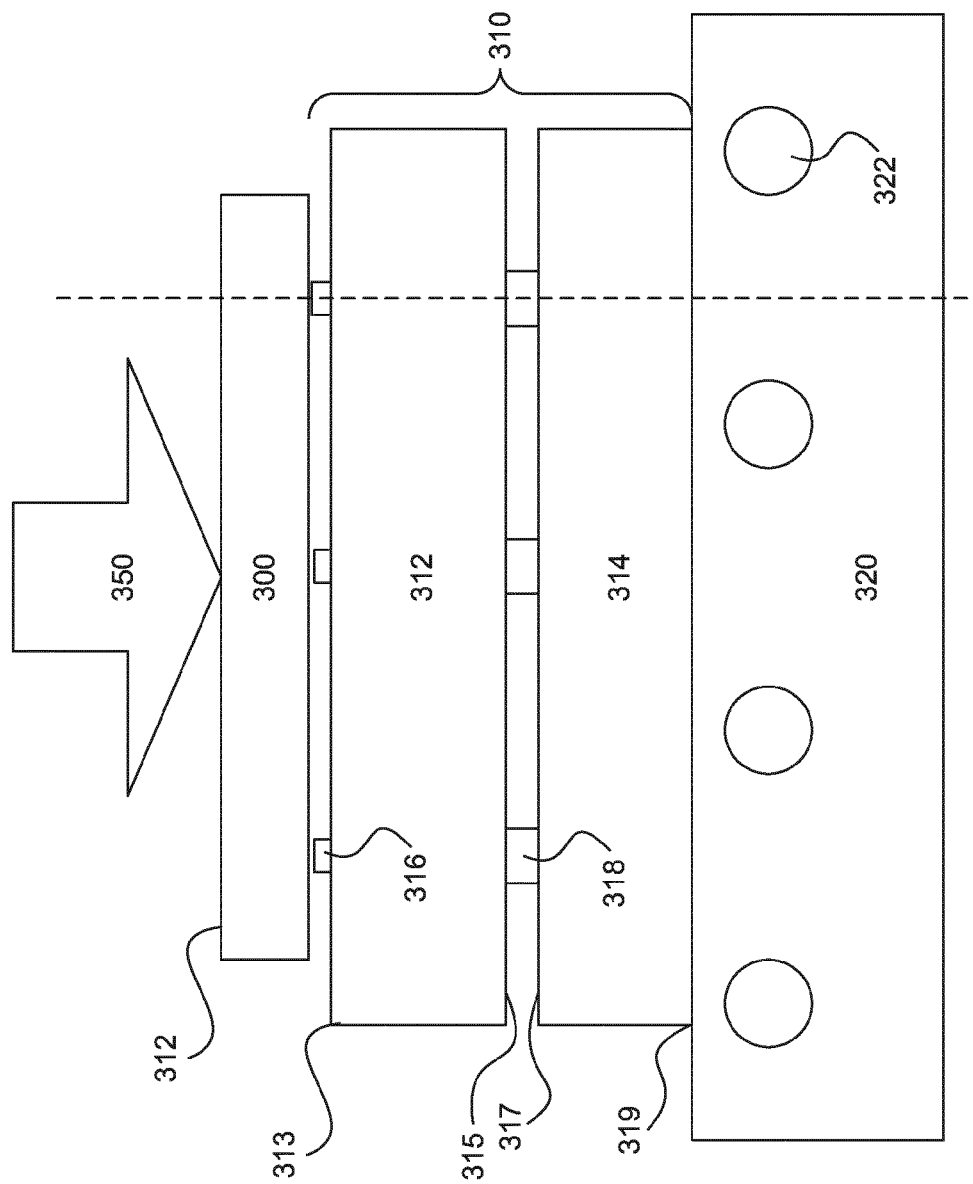
FIG. 3 is a view of a portion of a lithographic apparatus including a clamp and a chuck.

FIG. 3 shows a cross-sectional diagram of a portion of a lithographic apparatus, according to an embodiment. Specifically, FIG. 3 shows a reticle 300 coupled to a clamp 310. Clamp 310 is coupled to, e.g., bonded, to a chuck 320. As described above, a reticle is a device that imparts a pattern onto an incident beam of radiation. For example, reticle 300 can include a patterned reflective surface (e.g., plurality of mirrors that are arranged in an array and whose state can be controlled to determine the pattern that is imparted to the incident beam). (An incident beam of radiation is depicted in FIG. 3 using arrow 350.)

In an embodiment, clamp 310 can be an electrostatic clamp. For example, clamp 310 can generate an electrostatic field to hold reticle 300 in place. As described in greater detail below, electrostatic clamp 310 can include electrodes that generate this electrostatic field.

In one example, clamp 310 includes a first substrate 312 and a second substrate 314. First substrate 312 has opposing surfaces 313 and 315 and second substrate 314 has opposing surfaces 317 and 319. Surface 313 of first substrate 213 has burls 316 located on it. As shown in FIG. 3, burls 316 contact reticle 300.

When reticle 300 receives the incident beam of radiation, it can absorb power from the incident beam and heat up. For example, the incident beam can deliver 28 Watts of power. When heated, portions of reticle 300 can deform. For example, in the embodiment in which reticle 300 includes a reflective surface, portions of that surface can be deformed. In an embodiment, to prevent this deformation, it is desired to keep reticle 300 at substantially room temperature (approximately 22 degrees Celsius).

To accomplish this temperature control of reticle 300, clamp 310 can be maintained at a temperature lower than room temperature (e.g., 14 degrees Celsius). Through contact between clamp 310 and reticle 300 (e.g., through burls 316), heat can be transferred from reticle 300 to clamp 310. In contrast to conventional clamps that use coolant-filled channels, clamp 310 includes cooling elements 318 that are used to provide cooling. As would be appreciated by those skilled in the relevant art(s) based on the description herein, coolant-filled filled channels in a clamp can introduce a number of problems (e.g., cracking of the channels, which can lead to leaks of the coolant.).

In the example shown, cooling elements 318 are located between first and second substrates 312 and 314. For example, as shown in FIG. 3, cooling elements 318 are located between surface 315 of first substrate 312 and surface 317 of second substrate 314. Cooling elements 318 can be configured to cause electrons to travel from surface 315 of first substrate 312 to surface 317 of second substrate 314. Heat dissipates or travels as the electrons travel from first substrate 312 to second substrate 314, thereby cooling first substrate 312. As described in greater detail below, cooling elements 318 can be implemented using a variety of technologies (e.g., thermoelectric cooling or thermo-tunneling cooling).

In one example, as shown in the embodiment of FIG. 3, each of cooling elements 318 is substantially aligned with respect to a respective one of burls 316. In an embodiment, this alignment maintains the structural stability of clamp 310 and reticle 300, thereby further reducing the deformation of reticle 300.

In one example, clamp 310 is bonded to chuck 320. In an embodiment, clamp 310 is optically bonded to chuck 320. As would be appreciated by those skilled in the relevant art(s), other types of bonding or coupling can be used.

In an embodiment, chuck 320 can serve as a heat sink for clamp 310. As noted above, cooling elements 318 can be used to transfer heat away from first substrate 312. To prevent heat from building up in clamp 310, chuck 320 can serve as a heat sink to remove this heat from the system. For example, as shown in FIG. 3, chuck 320 includes channels 322. Channels 322 can be configured to accommodate the flow of a coolant (e.g., water). The coolant can be used to maintain the temperature of chuck 320 constant and thereby remove the heat from the system. For example, the coolant can be water maintained at 22 degrees Celsius.

First and second substrates 312 and 314 and chuck 320 can be made out of a variety of different materials used to form clamps in lithographic apparatuses. As shown in FIG. 3, first substrate 312 contacts reticle 300, second substrate 314 contacts first substrate 312, and chuck 320 contacts second substrate 314. So any deformation of first substrate 312, second substrate 314, or chuck 320 can cause deformation of reticle 300. Thus, in an embodiment, first substrate 312, second substrate 314, and/or chuck 320 can be formed out of a zero (or substantially zero) thermal expansion material. For example, silicon-based glass ceramic materials and multilayer glass materials often have the property of being zero (or substantially zero) thermal expansion materials. For example, one material that can be used is Zerodur® (produced by SCHOTT Corporation). First substrate 312, second substrate 314, and chuck 320 can be formed out of the same material or out different materials.

Thus, through the use of cooling elements 318, first substrate 312 of clamp 310 can be maintained at a temperature of approximately 14 degrees Celsius, thereby reducing or eliminating the heat-induced deformation of reticle 300.

Figure 17:
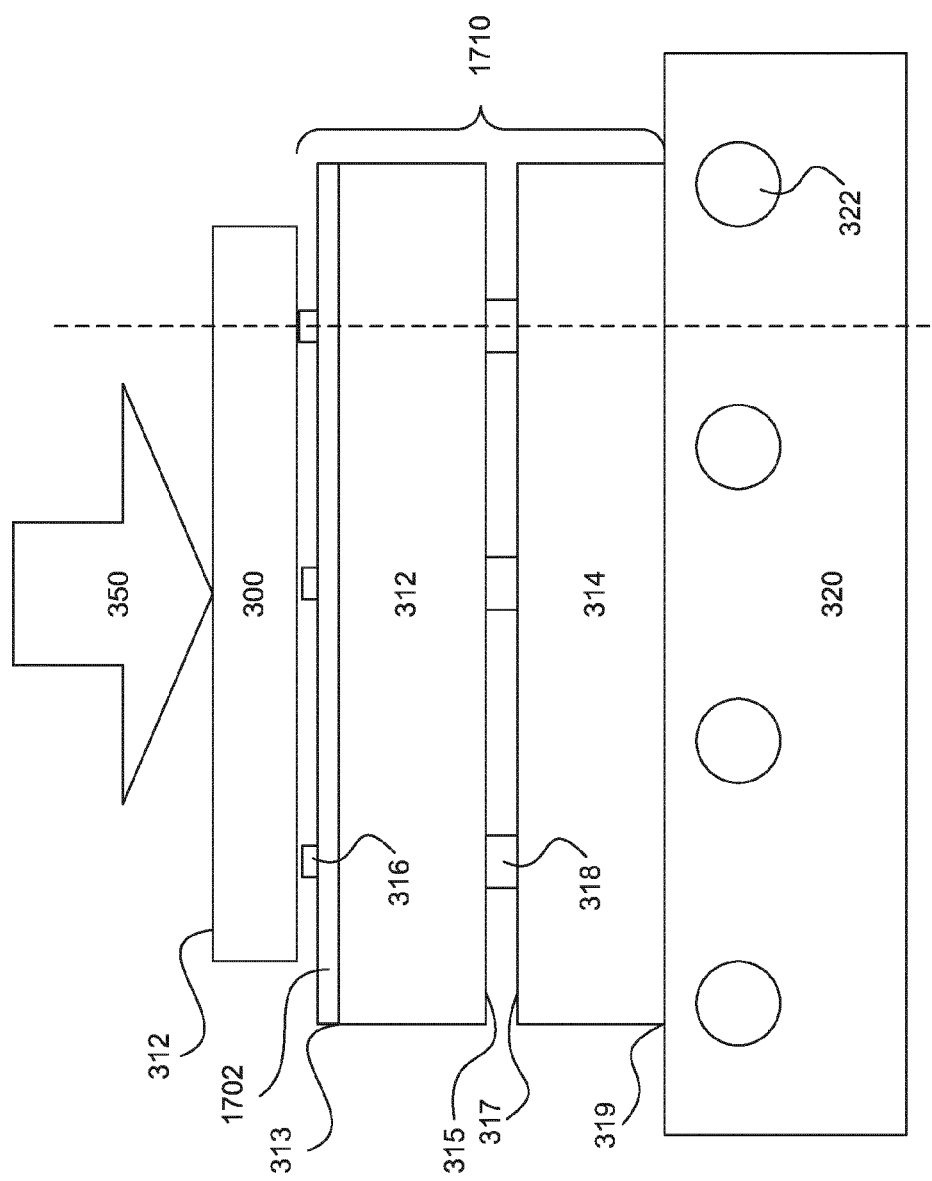
FIG. 17 is a view of a portion of a lithographic apparatus including a clamp and a chuck.

FIG. 17 shows a cross-sectional diagram of a portion of a lithographic apparatus, according to an embodiment. Specifically, FIG. 17 shows reticle 300 coupled to a clamp 1710. Clamp 1710 is substantially similar to clamp 310, except that clamp 1710 additionally includes a third substrate 1702. As shown in FIG. 17, third substrate 1702 is coupled to first surface 313 of first substrate 312 and burls 316 are formed on the top surface of third substrate 1702. In an embodiment, third substrate 1702 can be formed out of similar materials the materials used to form first and second substrate 312 and 314 (e.g., a zero, or substantially zero, coefficient of thermal expansion material such as a multilayer material or glass-ceramic material).

Figure 4:
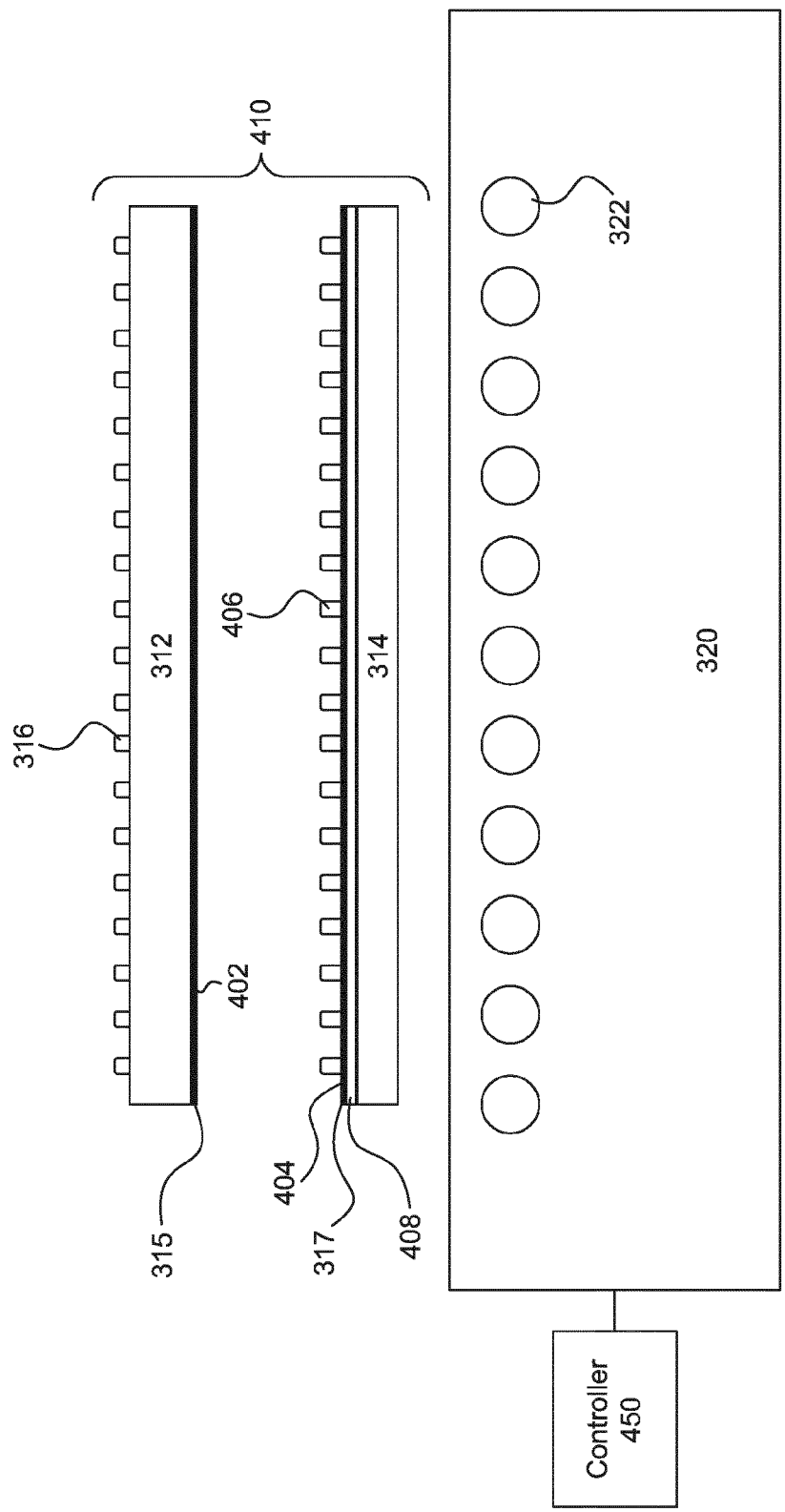
FIG. 4 is a schematic view of a portion of a lithographic apparatus including a clamp and a chuck.

FIG. 4 shows a functional, cross-sectional diagram of a portion of a lithographic apparatus, according to an embodiment. Specifically, FIG. 4 shows an embodiment of a clamp 410 and chuck 320. In the embodiment shown in FIG. 4, cooling elements are implemented as thermal electric cooling (TEC) bumps 406. For example, as shown in FIG. 4, TEC bumps 406 are located between surface 315 of first substrate 312 and surface 317 of second substrate 314. Each of TEC bumps 406 is aligned with respect to a respective one of burls 316.

In one example, TEC elements operate by taking advantage of the Peltier Effect. When electrons flow between two dissimilar materials, one material becomes colder and the other becomes warmer. In particular, as the electrons travel from a first material to a second material, the electrons take heat along with them. For example, in the embodiment of FIG. 4, a voltage difference can be established between opposite ends of each of TEC bumps 406 to generate a current passing therein. This current can be used to transfer heat from first substrate 312 to second substrate 314.

As shown in FIG. 4, a controller 450 is coupled to chuck 320. In an embodiment, controller 450 can be used to provide variable cooling. For example, controller 450 can be configured to control an amount of current that passes through each of TEC bumps 406. Thus, controller 450 can respond to changing cooling needs for different portions of reticle 300. For example, controller 450 can be used to adjust current flow so that all of first substrate 312 remains at approximately 14 degrees Celsius.

Moreover, the ability to control the amount of heat that is transferred from first substrate 312 can be used to offset possibly poor thermal conduction properties of first substrate 312. In particular, controller 450 can be used to increase the amount of current that flows from first substrate 312 to second substrate 314 to accommodate the possibly poor thermal conductive properties of first substrate 312. In contrast, in coolant-based electrostatic clamps, the coolant channels must be placed as close as possible to the reticle if the clamp has poor thermal conduction properties.

In an embodiment, controller 450 can be configured to provide variable cooling through an electrical connection with each of TEC bumps 406. For example, controller 450 can be electrically connected to TEC bumps 406 through wiring layers formed in first and second substrates 312 and 314 and chuck 320. Through this electrical connection, controller 450 can control the voltage difference across each of TEC bumps 406, and thereby control the current that passes through each of TEC bumps 406.

As would be appreciated by those skilled in the relevant art(s) based on the description herein, other configurations can be used to establish an electrical connection between controller 450 and TEC bumps 406. For example, controller 450 can instead be directly coupled to first substrate 312, thereby eliminating the need for wiring layers in second substrate 314 and chuck 320.

In the embodiment shown in FIG. 4, surfaces 315 and 317 are coated with diamond like carbon (DLC) coatings 402 and 404, respectively. In an embodiment, DLC coatings 402 and 404 can increase the thermal conduction between first substrate 312 and second substrate 314. The presence of DLC coatings 402 and 404 is optional: one or both may be omitted. In other embodiments, other coatings that promote heat transfer can be used instead of or in addition to DLC coatings 402 and 404.

As shown in FIG. 4, second substrate 314 includes a silicon layer 408. In an embodiment, silicon layer 408 can be used to facilitate the forming of TEC bumps 406. For example, in an embodiment, TEC bumps 406 can be created by a deposition process directly onto surface 317 of second substrate 314. This deposition process may be aided by the inclusion of silicon layer 408. In particular, standard deposition processes are often designed for depositing materials onto silicon. Thus, by including silicon layer 408, TEC bumps 406 can be created using these standard processes. The presence of silicon layer 408, however, is not required. For example, TEC bumps 406 can be created by direct deposition on to second substrate 314. Alternatively, other layers can be used instead of or in addition to silicon layer 408 to facilitate the creation of TEC bumps 406.

Figure 5:
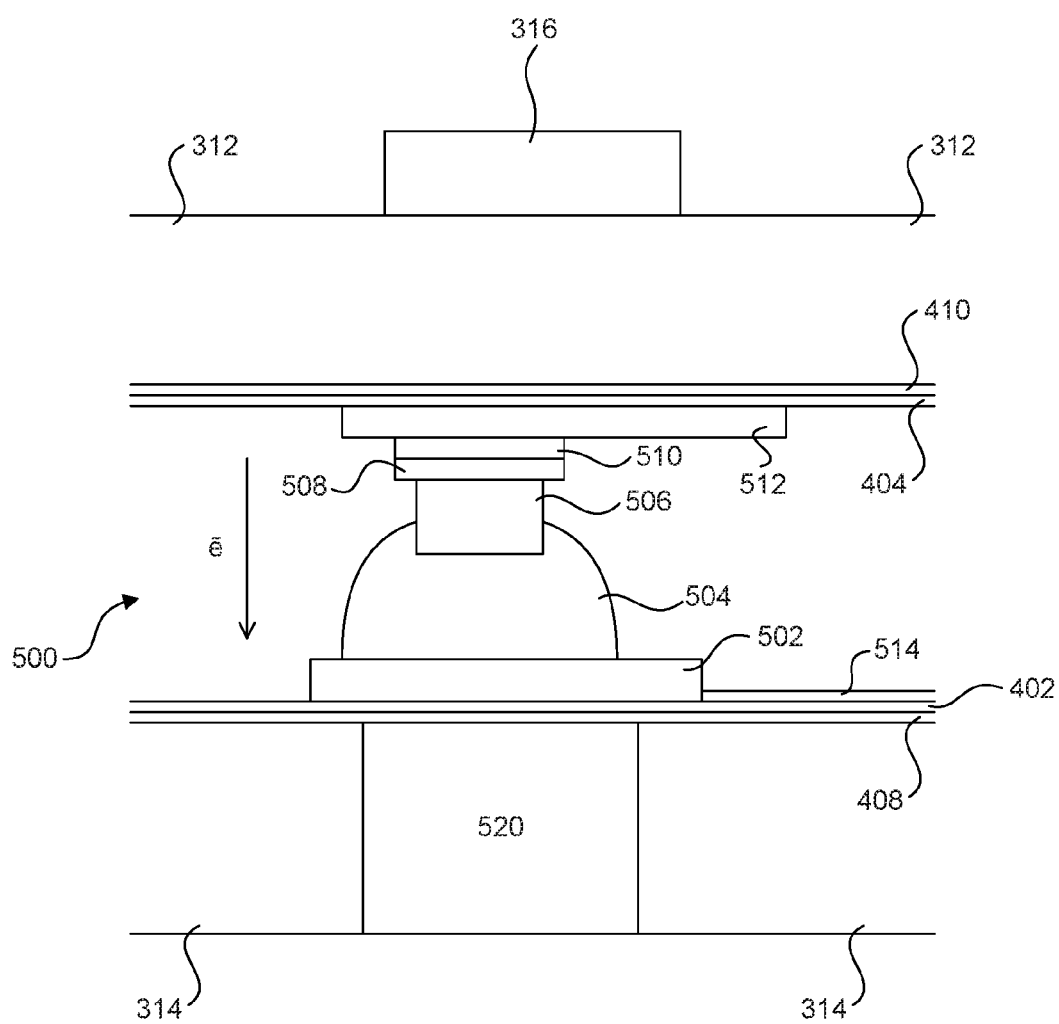
FIG. 5 is a view of a thermoelectric cooling bump.

FIG. 5 shows a cross-sectional diagram illustrating an embodiment of a TEC bump 500, according to an embodiment. As shown in FIG. 5, bump 500 includes a metal pad 502, a solder bump 504, a post 506, a metal pad 508, a thermoelectric layer 510, a metal trace 512, and a metal trace 514.

As shown in FIG. 5, to transfer heat from first substrate 312 to second substrate 314, electrons flow from metal trace 512, through thermoelectric layer 510, solder layer 508, post 506, bump 504, pad 502, and metal trace 514. In an embodiment, metal traces 512 and 514 and pads 502 and 512 can be formed out of electrically conductive materials, e.g., copper or aluminium. Further, in an embodiment, post 506 can be configured to mate with solder bump 504 during a solder reflow process to establish an electrical interconnection between first and second substrates 312 and 314. Post 506 can be formed out of an electrically conductive material, e.g., copper or aluminium.

In an embodiment, thermoelectric layer 510 can be either n-doped or p-doped to allow for active transfer of electrons from first substrate 312 to second substrate 314. In a further embodiment, different bumps 500 can include differently doped thermoelectric layers 510. For example, the doping of bumps 500 may alternate in adjacent bumps 500 to allow for complete circuit loops to be formed between first and second substrates 312 and 314 (with current traveling in one direction through a bump having an n-doped thermoelectric layer and traveling in the opposite direction through a bumps having a p-doped thermoelectric layer).

Pads 502 and 508 and metal traces 512 and 514 can be included in a loop that is controlled by a controller, e.g., controller 450. The controller can adjust the amount of current passing between first and second substrates 312 and 314 to control the amount of heat that is transferred from first substrate 312 to second substrate 314.

As noted above, to enhance the structural integrity of clamp 410 and reticle 300, cooling elements such as TEC bump 500 can be substantially aligned with respective ones of burls 316. In an embodiment, the use of TEC elements implemented as TEC bumps enhances the alignment between burls 316 and respective cooling elements. In particular, the relatively small size of TEC bump 500 (e.g., on the order of 100 µm in length, width, and thickness) enhances the resolution of TEC bump 500 allowing for greater alignment with burls 316.

As noted above, TEC bump 500 can be used to transfer heat from first substrate 312 to second substrate 314. Once the heat is transferred to second substrate 314, the heat is transferred to chuck 320, which can act as a heat sink. To facilitate the transfer of heat from second substrate 314 to chuck 320, second substrate 314 can include a thermal via 520. Thermal via 520 can be filled with a thermally conductive material, e.g., copper or aluminium, to facilitate the transfer of heat from second substrate 314 to chuck 320.

Figure 6:
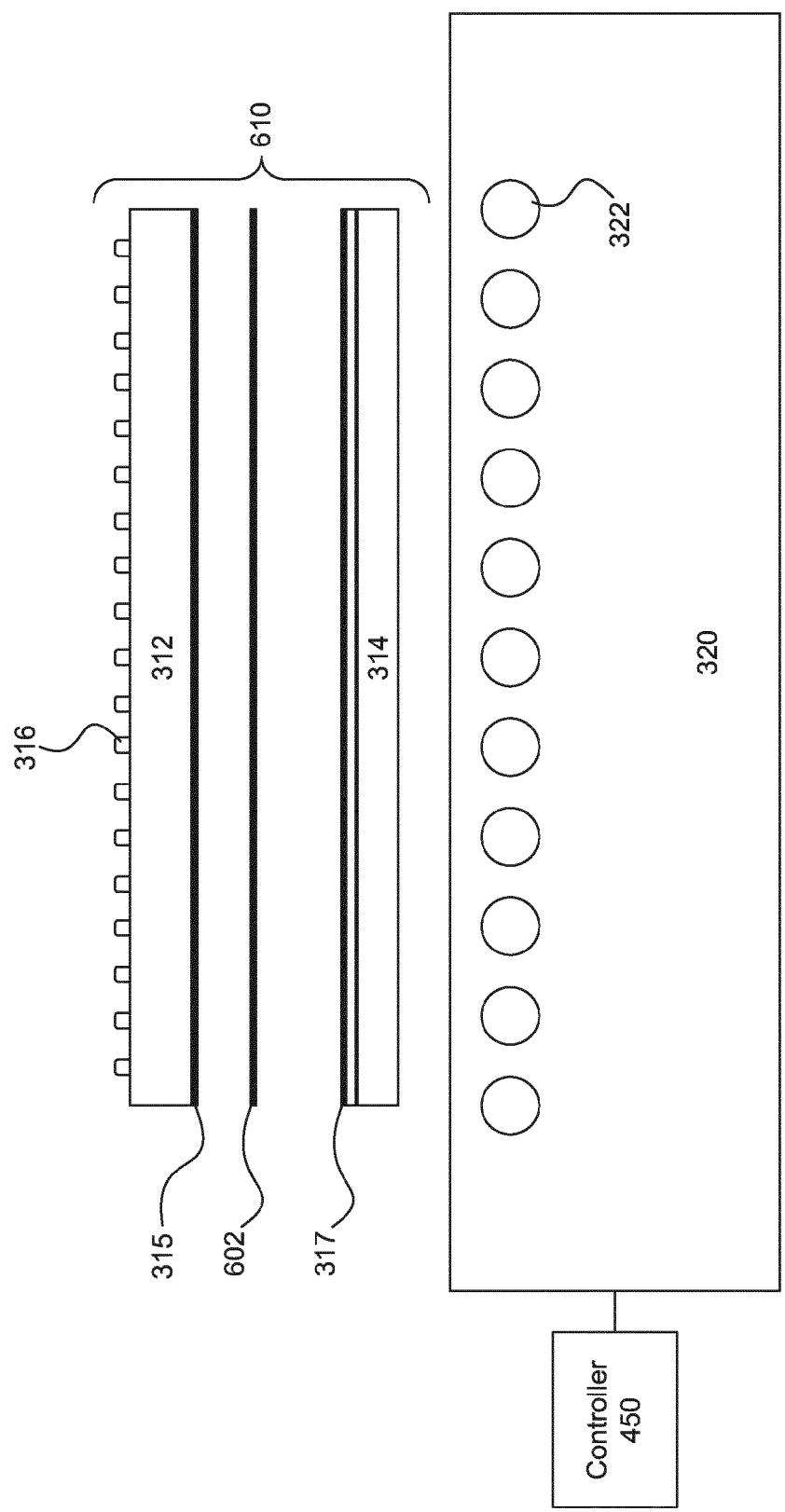
FIG. 6 is a schematic view of a portion of a lithographic apparatus including a clamp and a chuck.

FIG. 6 shows a cross-sectional diagram of a portion of a lithographic apparatus, according to an embodiment. More specifically, FIG. 6 shows a cross-sectional diagram including chuck 320 and a clamp 610. Clamp 610 is substantially similar to clamp 410 shown in FIG. 4, except that TEC bumps 406 are replaced with a TEC film 602. In an embodiment, TEC film 602 can be relatively thin. For example, in one embodiment, TEC film 602 can be on the order of 100 µm thick.

Figure 7:
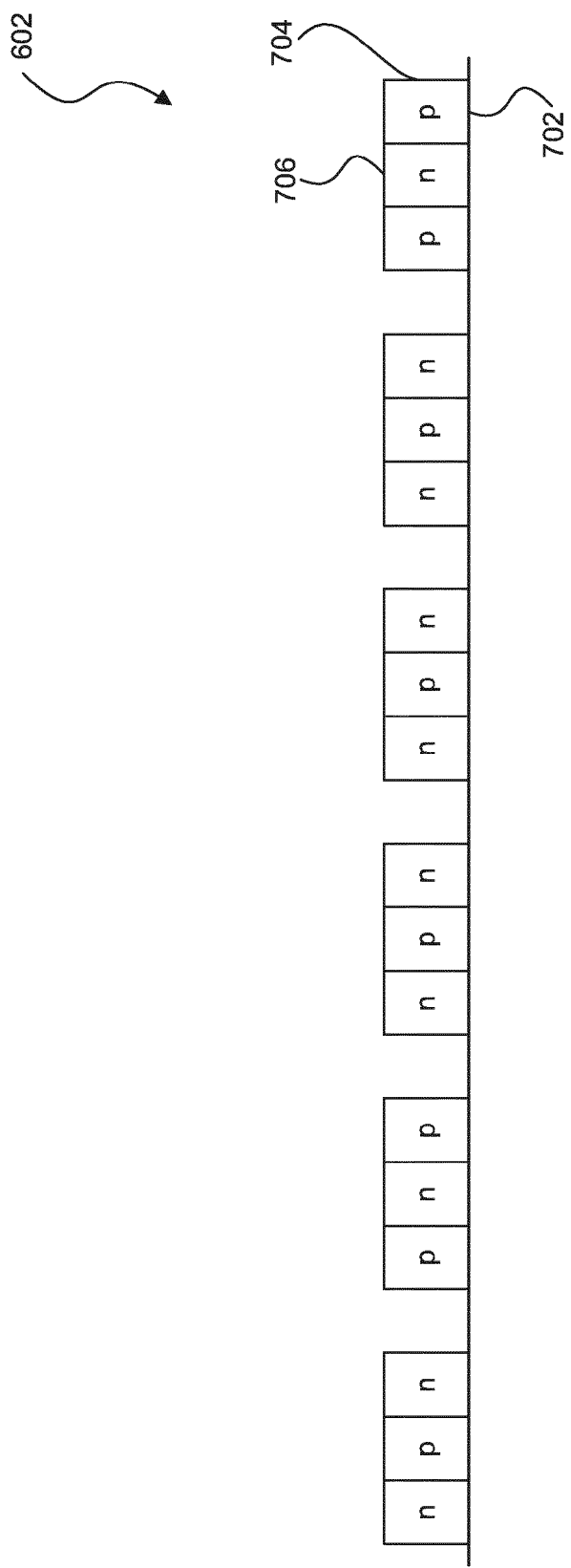
FIG. 7 is a cross-sectional diagram of a thermoelectric cooling film.

FIG. 7 shows a cross-sectional diagram of TEC film 602, according to an embodiment. As shown in FIG. 7, TEC film 602 includes a metal plane 702, conductive elements 704, and metal plates 706. As shown in FIG. 7, metal plates 706 electrically couple adjacent conductive elements 704. Conductive elements 704 can be n-doped or p-doped and can be used to facilitate the flow of electrons from first substrate 312 to second substrate 314, thereby cooling first substrate 312. For example, as shown in the embodiment of FIG. 7, conductive elements 704 can be alternately n- and p-doped to create loops of current passing between first and second substrates 312 and 314.

Figure 8:
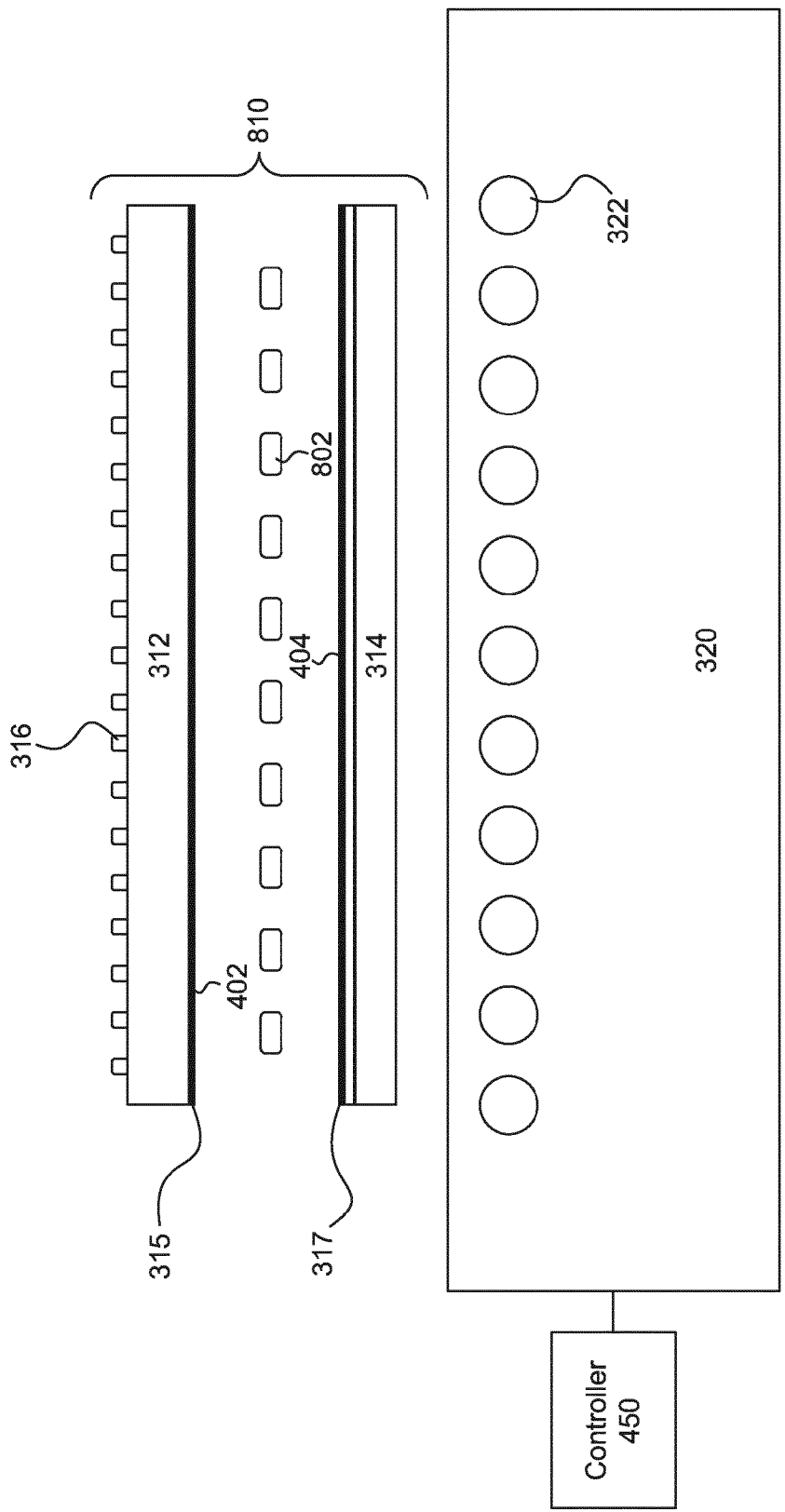
FIGS. 8 and 9 are schematic views of portions of a lithographic apparatus including a clamp and a chuck.

FIG. 8 shows a cross-sectional diagram of a portion of a lithographic apparatus including chuck 320 and electrostatic clamp 810. Clamp 810 is substantially similar to clamp 410 shown in FIG. 4, except that TEC bumps 406 are replaced with TEC modules 802. In an embodiment, each of TEC modules 802 can be bonded to surfaces 315 and 317 to facilitate the flow of electrons from first substrate 312 to second substrate 314. In an embodiment, TEC modules 802 can be approximately 0.6 mm thick and approximately 1 mm in both length and width. In an embodiment, TEC modules 802 can be bonded to surfaces 315 and 317 using glue. In alternate embodiment, other adhesive methods can be used, e.g., solder or nanofoil solder.

Figure 9:
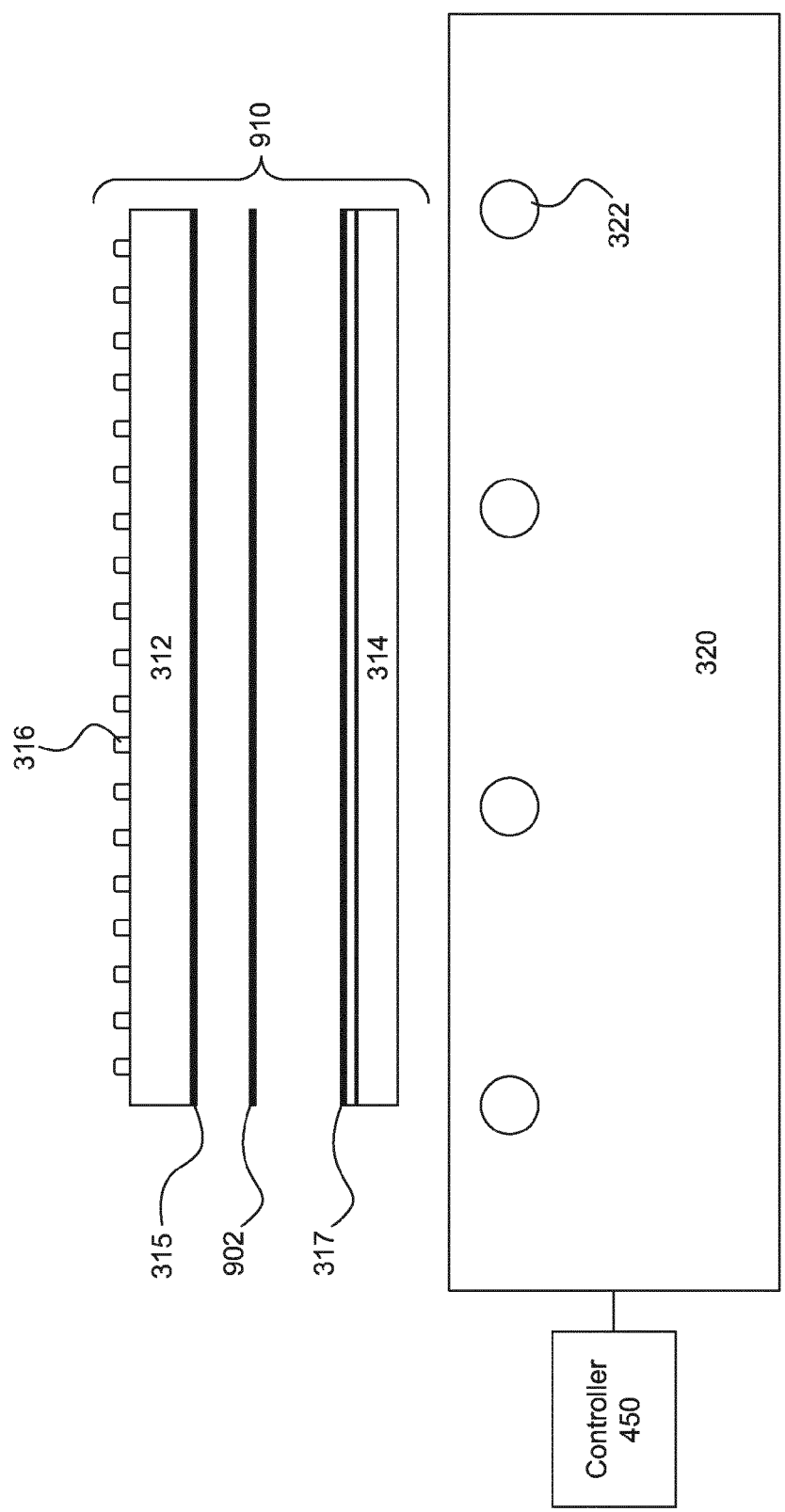

FIG. 9 shows a cross-sectional diagram of a lithographic apparatus including chuck 320 and clamp 910, according to an embodiment. Clamp 910 is substantially similar to clamp 410 as shown in FIG. 4, except that TEC bumps 406 are replaced with a thermal tunnel cooling (TTC) array 902.

TTC elements work in a manner similar to TEC elements. In particular, electrons are used to transfer heat from one material to another (e.g., in FIG. 9 from first substrate 312 to second substrate 314). Unlike TEC elements, however, TTC elements do not include a conductor between the two materials. Rather, TTC elements rely on quantum tunneling to pass electrons between the two materials. For example, in FIG. 9, TTC array 902 can include an array of TTC elements, each of which includes two metal plates that are separated by a distance on the order of 5 nm By controlling the voltage on the two different plates, controller 450 can control the magnitude and direction of the flow of electrons that tunnel between the two plates, and thereby control the amount of heat transferred from first substrate 312 to second substrate 314. Moreover, like TEC bumps 406, the elements of TTC array 902 can be substantially aligned with respective burls 316. Aligning cooling elements with a respective burl 316 can enhance the structural stability of clamp 910, thereby reducing the deformation of the reticle attached thereto.

Figure 10:
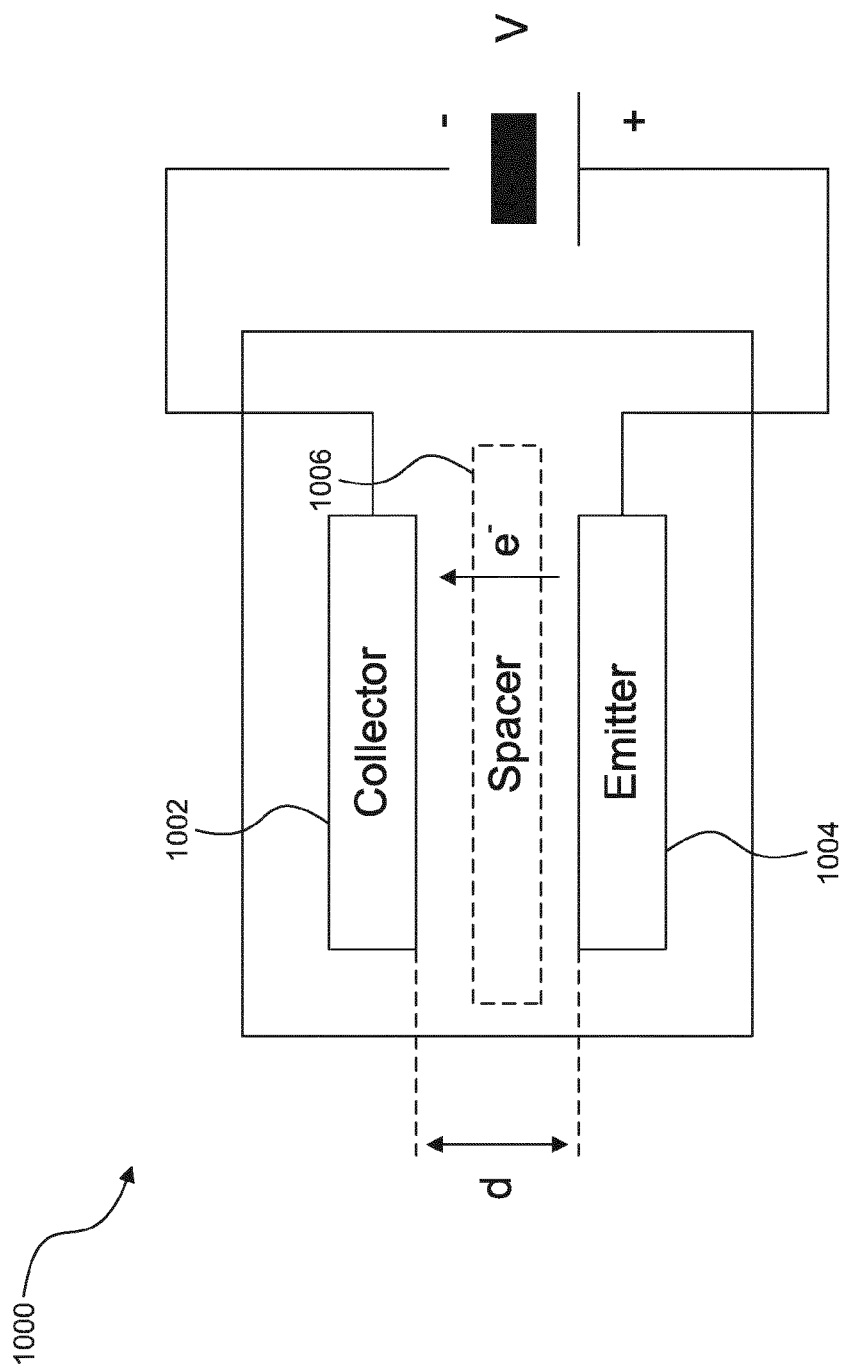
FIG. 10 is a schematic diagram of a thermo tunneling cooling element.

FIG. 10 shows a functional diagram of a TTC element 1000, according to an embodiment. TTC element 1000 includes metal plates 1002 and 1004. As shown in FIG. 10, metal plate 1002 is a collector plate and metal plate 1004 is an emitter plate. Plates 1002 and 1004 are separated by a distance d. In an embodiment, distance d can be on the order of 5 nm. In an embodiment, TTC element 1000 can include a spacer 1006 that can maintain the distance d between plates 1002 and 1004. Spacer 1006 can be formed out of a suitable dielectric material. In this embodiment, TTC element 1000 is fabricated by a special sandwich of semiconductor materials and emitter-collector metals. Spacer 1006 is chemically removed and sealed in a vacuum, leaving relatively small piezoelectric actuators that maintain the distance d between plates 1002 and 1004. The vacuum gap insulates against conductive heat losses, resulting in high Carnot efficiency.

Electrons can tunnel from plate 1004 to plate 1002 based on the voltage difference V between plates 1004 and 1002. In an embodiment, a controller, e.g., controller 450, can be configured to control voltage V for each TTC element in an array to provide tailored cooling. Both electrons at low energy levels (e.g., around the Fermi level) and electrons at high energy levels participate in tunneling through the potential barrier between plates 1004 and 1002, thereby transferring heat from the emitter to the collector. In doing so, the efficiency remains high in the wide range of the emitter electric fields.

As will be appreciated by those skilled in the relevant art based on the description herein, TTC elements can often be used in situations where the lowest cooling temperature approximately is 600 degrees Celsius. This temperature is well outside of the normal operating temperature of a lithographic apparatus. However, by bringing plates 1002 and 1004 to a distance in the nanometer range, electrons can tunnel across this short distance, carrying the heat with them whereby cooling can be provided at temperatures of approximately 22 degrees C. Emitter plate 1004 employs a special metal. In an embodiment, the special metal has superlattices or resonant tunneling structures on its surface, either of which effectively indent emitter plate 1004. These nanostructures can interact with the wave properties of electrons in the emitter solid, changing their behavior and lowering the work function of the material. The work function is defined as the amount of energy needed for an electron to leave the emitter's surface. A wide spectrum of electron energies participate in vacuum thermionic emission heat pumping.

In an embodiment, TTC elements can be relatively efficient as compared to TEC elements. For example, the Carnot efficiency of TTC elements can be between 40% and 55%, while the Carnot efficiency of TEC elements can be between 5% and 7%.

Methods and Systems for Forming a Clamp from Cordierite

Cordierite is a magnesium and iron-based crystal. It has higher thermal conductivity than many materials that are used to make clamps and also has a relatively high stiffness. Moreover, cordierite exhibits substantially zero thermal expansion at or around room temperature.

Figure 11:
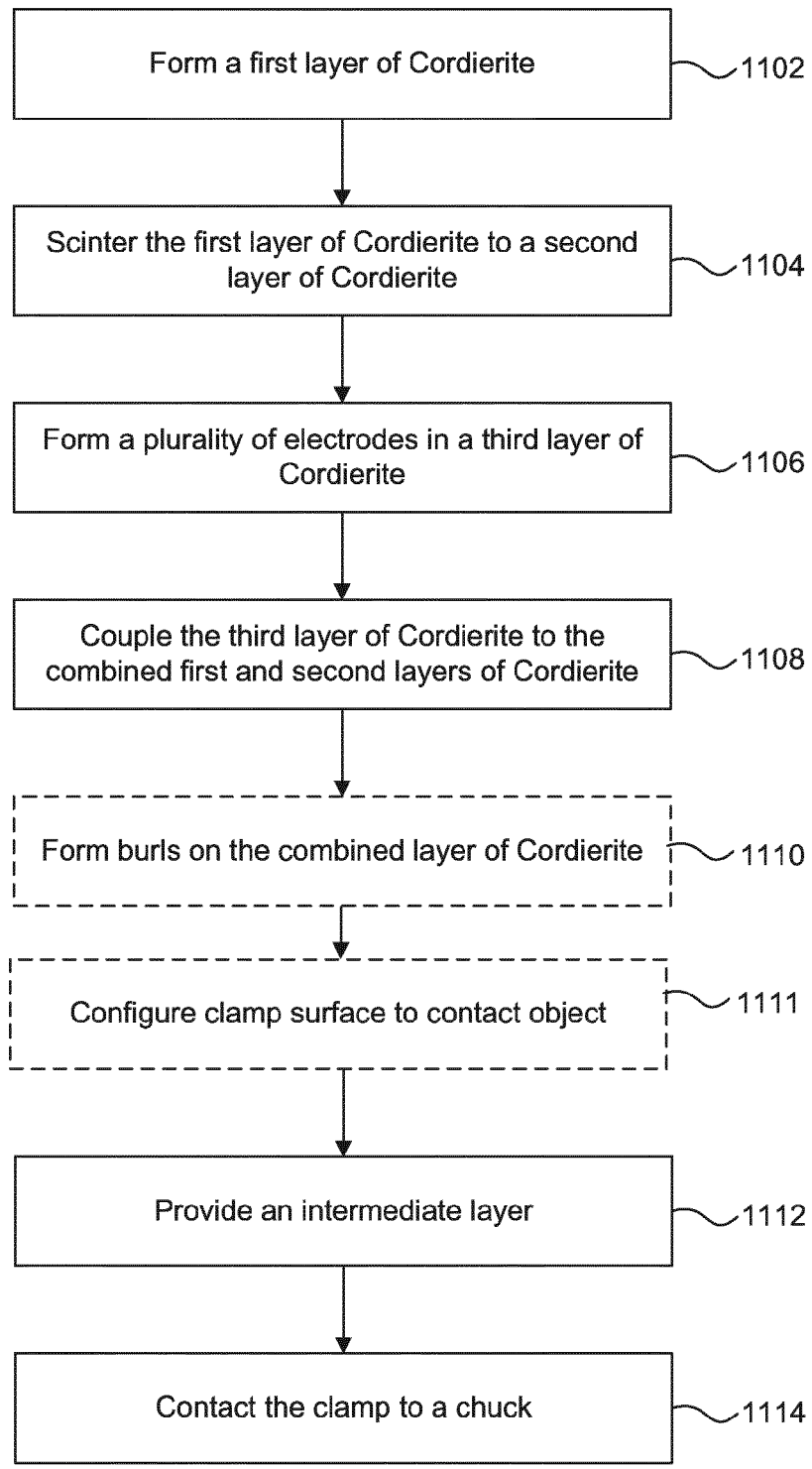
FIG. 11 is flowchart of a method of forming a clamp out of cordierite.

FIG. 11 shows a method 1100 of forming a clamp out of cordierite, according to an embodiment. Not all steps of method 1100 maybe required, nor do all the steps shown in FIG. 11 necessarily have to occur in the order shown.

In step 1102, a first layer of cordierite is formed. For example, a layer of cordierite 1202 shown in FIG. 12 can be formed. Layer 1202 includes channels 1204. In an embodiment, channels 1204 can be configured to accommodate the flow of a coolant (e.g., water) through the clamp. In an embodiment, channels 1204 can be formed while layer 1202 is in a "green" state. In the "green" state, layer 1202 is porous and can be manipulated. For example, channels 1204 can be formed by machining or drilling.

Figure 12:
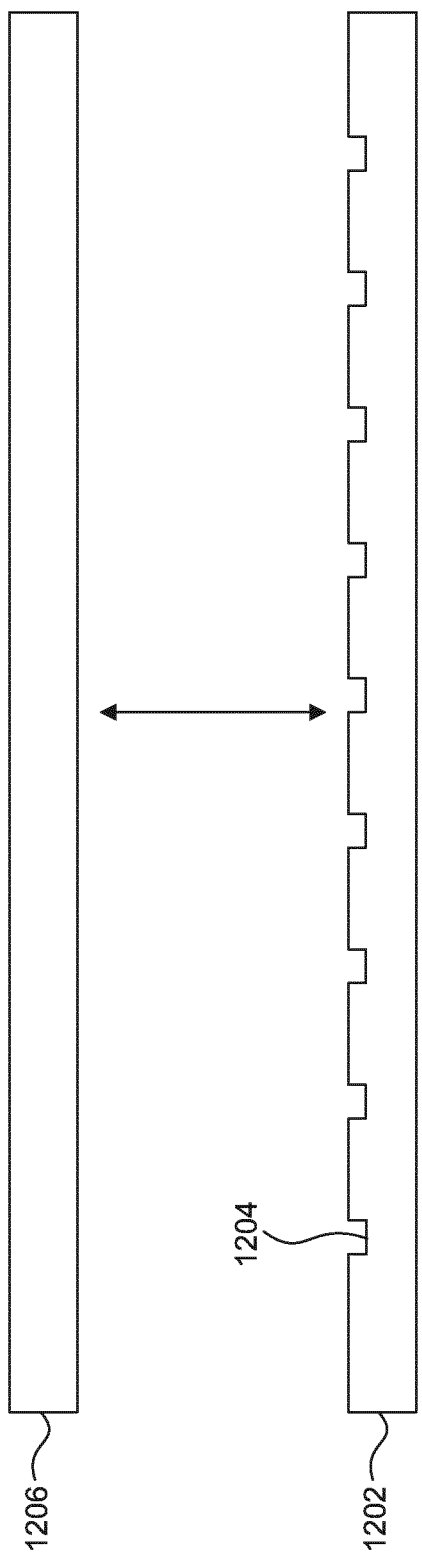
FIGS. 12-16 illustrate intermediate steps in the flowchart of FIG. 11.

In step 1104, the first layer of cordierite is scintered to a second layer of cordierite. For example, as shown in FIG. 12, layer 1202 can be scintered to a layer 1206 of cordierite. As shown in FIG. 12, layer 1206 can be substantially planar. In alternative embodiments, layer 1206 can have other shapes.

In an embodiment, scintering the layers 1202 and 1206 creates a fusion bond. Once layers 1202 and 1206 have been bonded, the resulting combined layer of cordierite is annealed into a dense state. In this dense state, cordierite may be difficult to manipulate. In one embodiment, layers 1202 and 1206 can be joined using a co-fired bond. To create a co-fired bond, layers 1202 and 1206, each in the "green" state, can be pressed together and placed in an oven, which is heated to approximately 1,300° C.

Alternatively, layers 1202 and 1206 can be joined using a direct bond. To create the direct bond, layers 1202 and 1206, each already having been individually scintered into the dense state, can be pressed together in an oven, which is heated to approximately 1,200° C.

To flatten the surfaces of the combined layer, however, the cordierite layer can be polished and/or grinded.

Figure 13A:
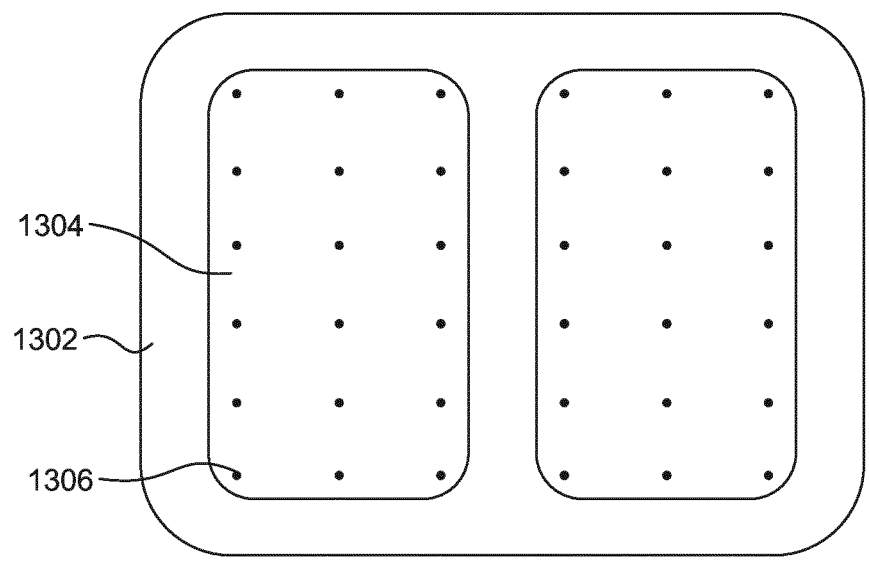
Figure 13B:
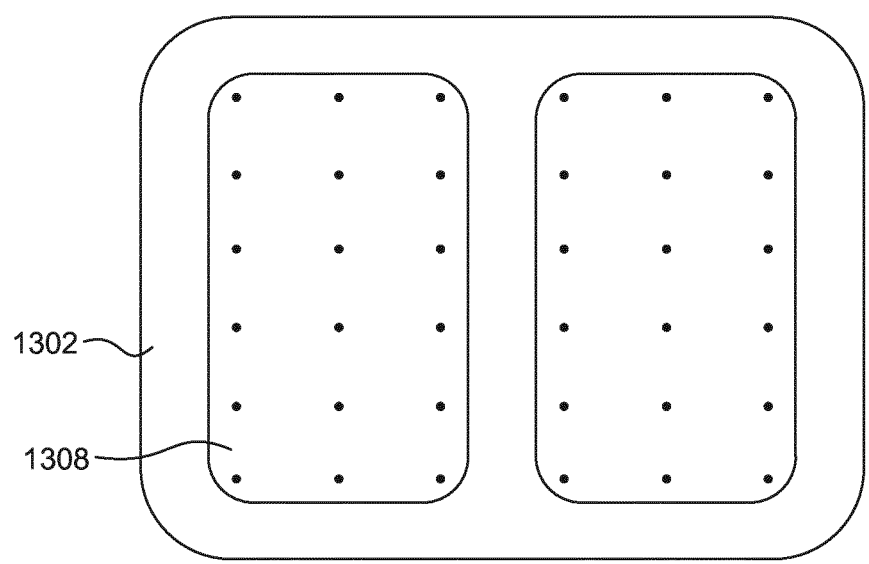

In step 1106, a plurality of electrodes is formed in a third layer of cordierite, e.g., using thin film deposition (TFD). For example, FIG. 13A shows a top view of a layer of cordierite 1302. As shown in FIG. 13A, layer 1302 has trenches 1304 formed therein. Moreover, layer 1302 can also include bumps 1306 formed within the trenches. In an embodiment, trenches 1304 can be formed using ion beam figuring (IBF). Bumps 1306 can be left in place to provide structural support for the resulting clamp. As shown in FIG. 13B, trenches 1304 can be filled with an electrically conductive material 1308. In an embodiment, electrically conductive material 1308 is aluminium (Al). Once hardened, the electrically conductive material can serve as electrodes.

In an embodiment, before trenches 1304 are filled with electrically conductive material 1308, a dielectric material can be applied to trenches 1304 for planarization. For example, a layer of benzocyclobutene (BCB) can be applied to planarize the surface onto which electrically conductive material 1308 will be applied. The BCB layer can further act as an adhesive for electrically conductive material 1308.

A dielectric isolation layer (e.g., silicon dioxide ($SiO_2$)), can also be applied to electrically conductive material 1308. In a further embodiment, the dielectric layer is relatively thin, e.g., less than 10 µm. Because a thin dielectric layer decreases the gap between the clamp and the reticle, using a thin dielectric layer can increase the clamping force for a given voltage.

In another embodiment, a thin film transfer (TFD) process can be used to form the electrodes. In a TFD process, nitrogen (N) is applied to a silicon (Si) wafer. An electrically conductive material (e.g., Al) is then applied to the wafer and a dielectric isolation layer (e.g., a $SiO_2$ layer) can be applied to the electrically conductive material. The silicon portion of the wafer can then be removed (e.g., via etching or grinding), leaving the electrodes. These electrodes can be inserted in trenches 1304.

Figure 14:
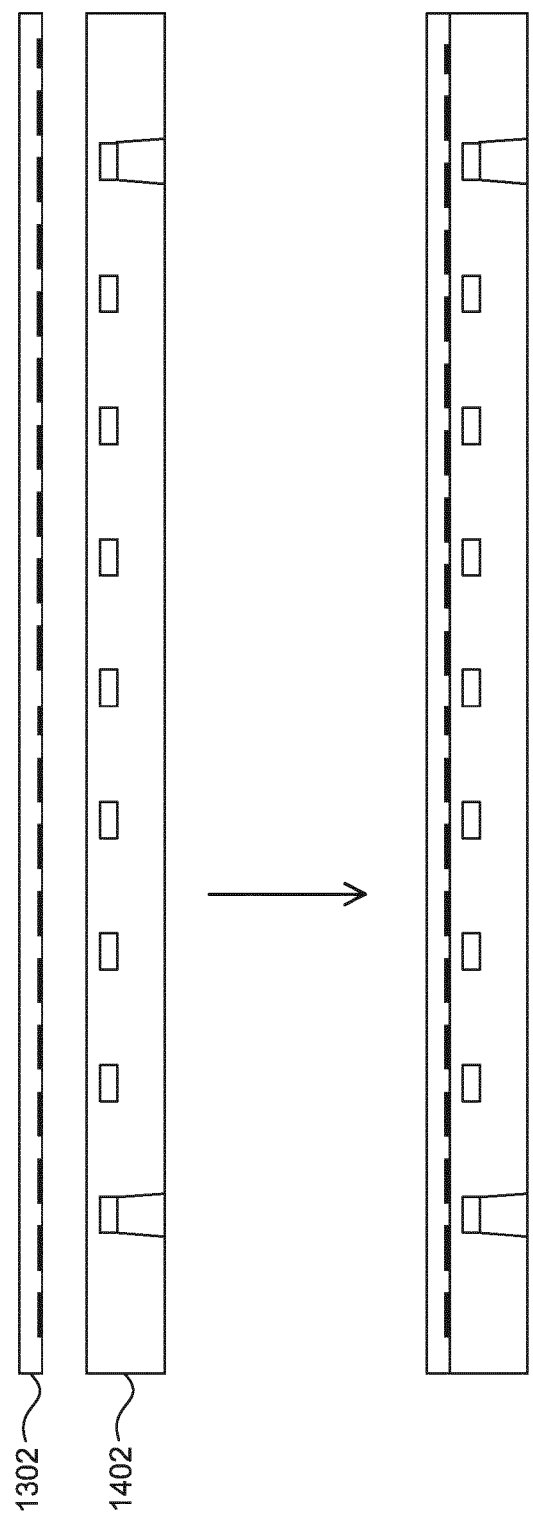

In step 1108, the third layer of cordierite is bonded to the combined first and second layers of cordierite. For example, as shown in FIG. 14, layer 1302 is bonded to a layer of cordierite 1402. In an embodiment, layer 1402 is the combination of layers 1202 and 1206 shown in FIG. 12. In an embodiment, layers 1302 and 1402 are combined when both are in dense states. For example, because the dimensions of the two layers must remain constant through this bonding process, bonding may be done in the dense state. In an embodiment, bonding of layers 1302 and 1402 can be done at high pressure and using high temperatures.

Figure 15:
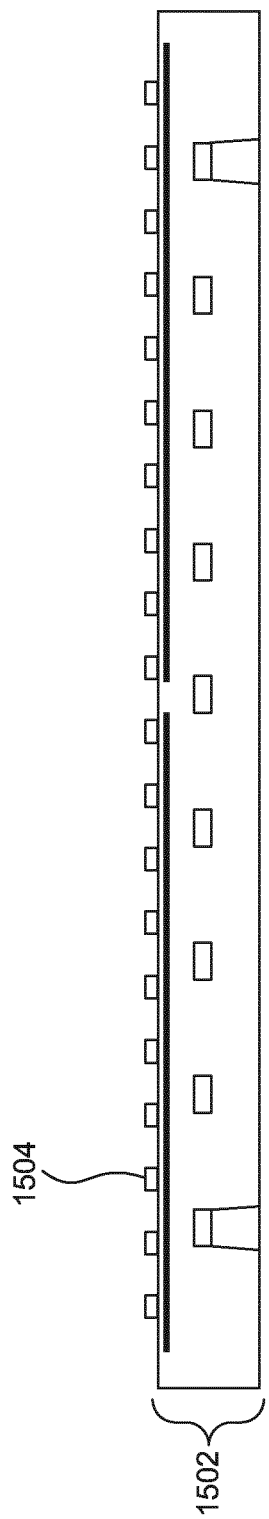

In optional step 1110, burls are formed on the combined layer of cordierite. For example, as shown in FIG. 15, burls 1504 can be formed on combined cordierite layer 1502. In an embodiment, combined cordierite layer 1502 is the combination of layers 1302 and 1402. In an embodiment, the burls can be formed by applying photoresist, patterning the photoresist, and dissolving unprotected regions of cordierite with, e.g., hydrochloric acid. In a further embodiment, a coating can be applied to the burls. For example, as shown in FIG. 15, a coating 1506 is applied to burls 1504 and the top surface of cordierite layer 1502. Coating 1506 can be an electrically conductive coating, e.g., a titanium nitride (TiN) coating. Coating 1506 can prevent residual charges from building up on the surface of burls 1504, thereby reducing sticking effects, and can reduce the effects of wear on burls 1504. Coating 1506 can also be used to control the surface properties of burls 1504 (e.g., by controlling the thickness of coating 1506).

In an embodiment, step 1110 can be omitted. For example, as described below, the surface of the cordierite clamp itself can be used to contact an object such as a reticle. In a further embodiment, if the surface of the cordierite clamp is itself used, any dielectric material used to planarize the surface of the cordierite clamp, e.g., a BCB material, can be removed from the burls (e.g., by grinding). In another embodiment, the surface roughness of the burls (or the surface of the cordierite clamp) can be controlled using, e.g., IBF.

In optional step 1111, the surface of the cordierite clamp is configured to contact (e.g., touch) an object (e.g., a reticle). For example, referring to FIG. 14, the top surface of layer 1302 can be polished to allow it to contact, or touch, a reticle. In an embodiment, the polishing can be diamond polishing. For example, diamond polishing can be used to polish the top surface of layer 1302 until bumps approximately 20-30 nm high remain. For example, cordierite can include a structure of a mixed compound or hardness that provide a network of bumps on its surface, even after polishing. These bumps can be hard enough to satisfy clamp reticle load lifetime requirements. Thus, the bumps that remain on the surface of the cordierite can effectively be used as burls.

Omitting burls on the surface of layer 1302 can have significant advantages. For example, omitting the burls and instead using bumps on the surface of the cordierite can increase the throughput for the manufacturing of clamps. Moreover, the surface roughness of the cordierite can decrease sticking effects between the clamp and the object it holds (e.g., a reticle).

Figure 16:
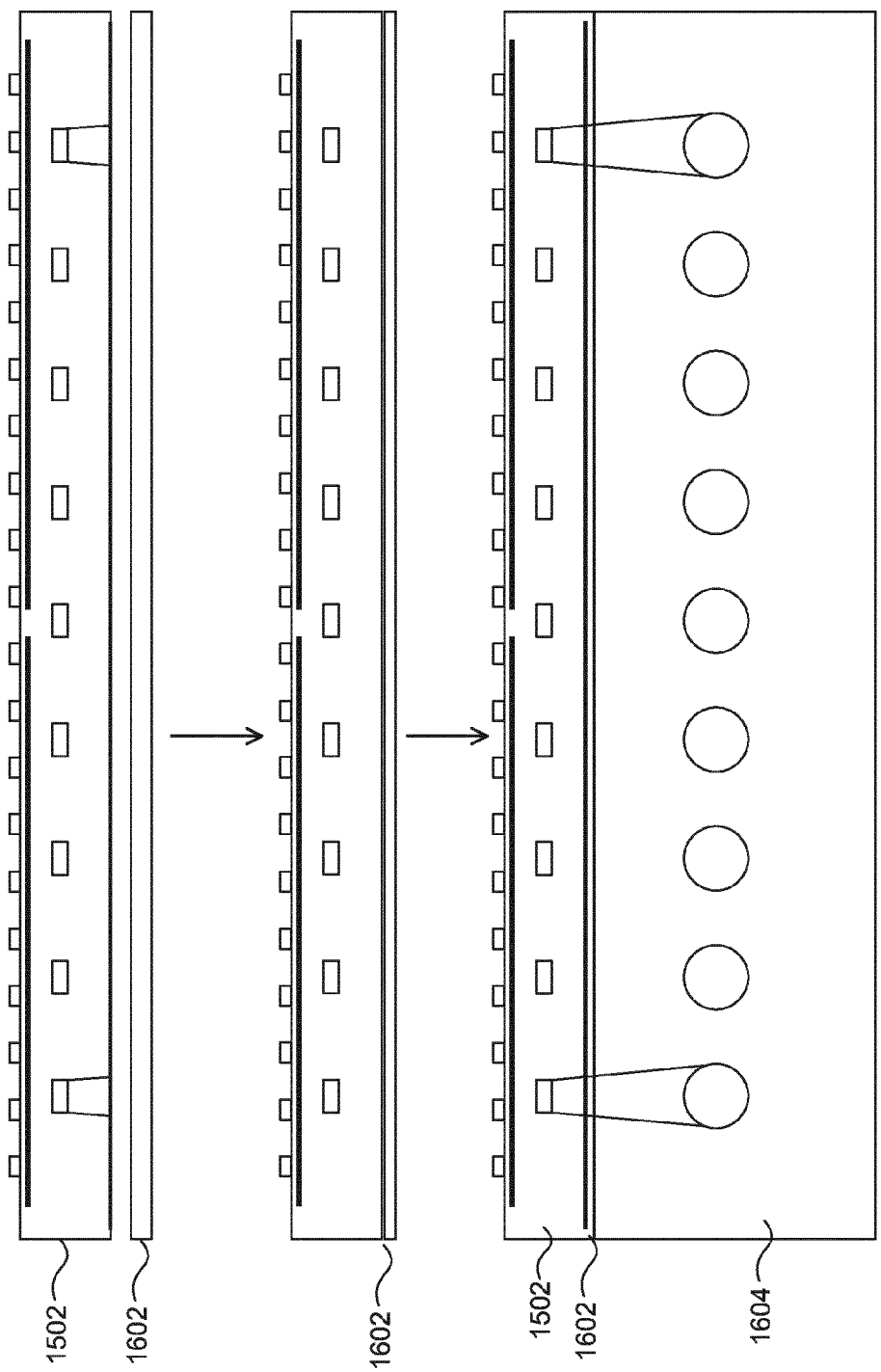

In step 1112, an intermediate layer is provided. For example, as shown in FIG. 16, an intermediate layer 1602 is provided on clamp 1502. In an embodiment, intermediate layer 1602 is a silicon-based glass that is anodically bonded to clamp 1502 (e.g., Zerodur®). In another embodiment, layer 1602 is a layer of silicon dioxide. In such an embodiment, the layer of silicon dioxide can be grown on clamp 1502. In another embodiment, intermediate layer 1602 can instead be a metal layer. In such an embodiment, intermediate layer 1602 can be provided by growing a metal layer on clamp 1502 or bonding a pre-formed metal layer to clamp 1502.

Intermediate layer 1602 can enhance an adhesion between clamp 1502 and a chuck 1604. As will be appreciated by those skilled in the relevant arts, there is often difficulty in contacting cordierite with other structures. For example, it can be difficult to polish cordierite can a sufficient smoothness to allow for contacting with other materials. Thus, by providing intermediate layer 1602 and polishing the intermediate layer, the bond between clamp 1502 and chuck 1604 can be strengthened.

In step 1114, the clamp is coupled to the chuck. For example, in an embodiment, the clamp is optically bonded to the chuck. For example, as shown in FIG. 16, clamp 1502 can be optically bonded to chuck 1604 through the use of intermediate layer 1602. For example, clamp 1502 and be pressed against chuck 1604 in an oven, which is heated to 300° C. In an embodiment, step 1112 can be omitted. In such an embodiment, clamp 1502 can be directly bonded to chuck 1604. For example, clamp 1502 can be pressed against chuck 1604 in an oven, which is heated to 300° C.

Figure 18:
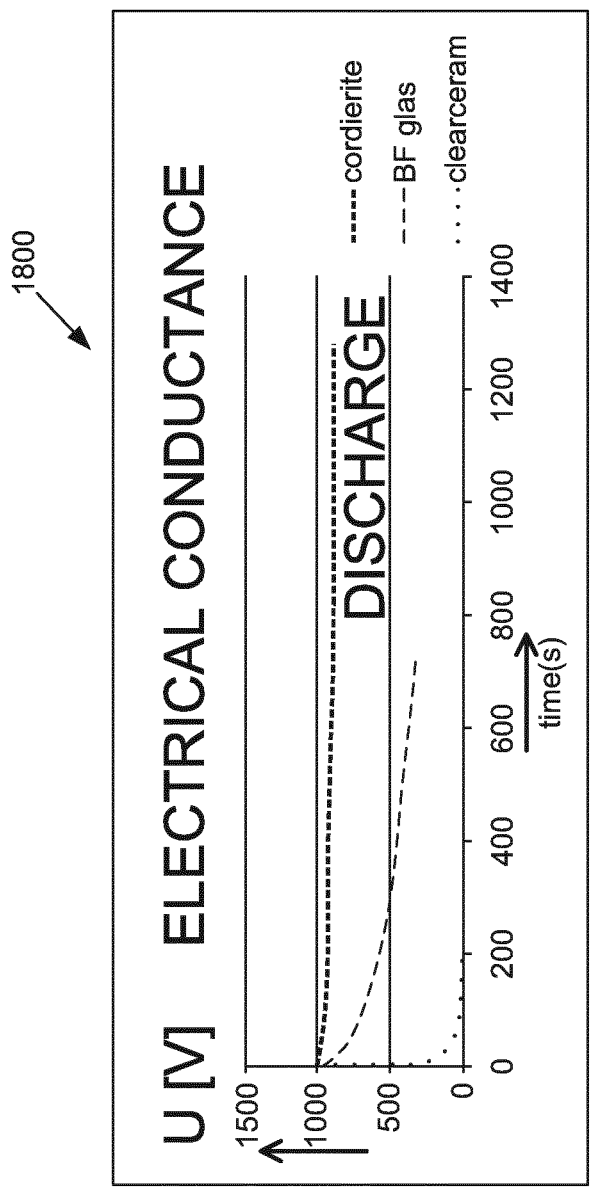
FIG. 18 is a plot illustrating the electrical conductance of different materials, including cordierite.

FIG. 18 is a plot 1800 showing the electrical conductance of cordierite, BF glass, and Clearceram® glass. In particular, plot 1800 illustrates the retention of surface charges on a material over a given time. As shown in FIG. 18, cordierite retains surface charges relatively well compared to BF glass and Clearceram® glass. Thus, cordierite is a better insulator than BF glass or Clearceram® glass.

Figure 19:
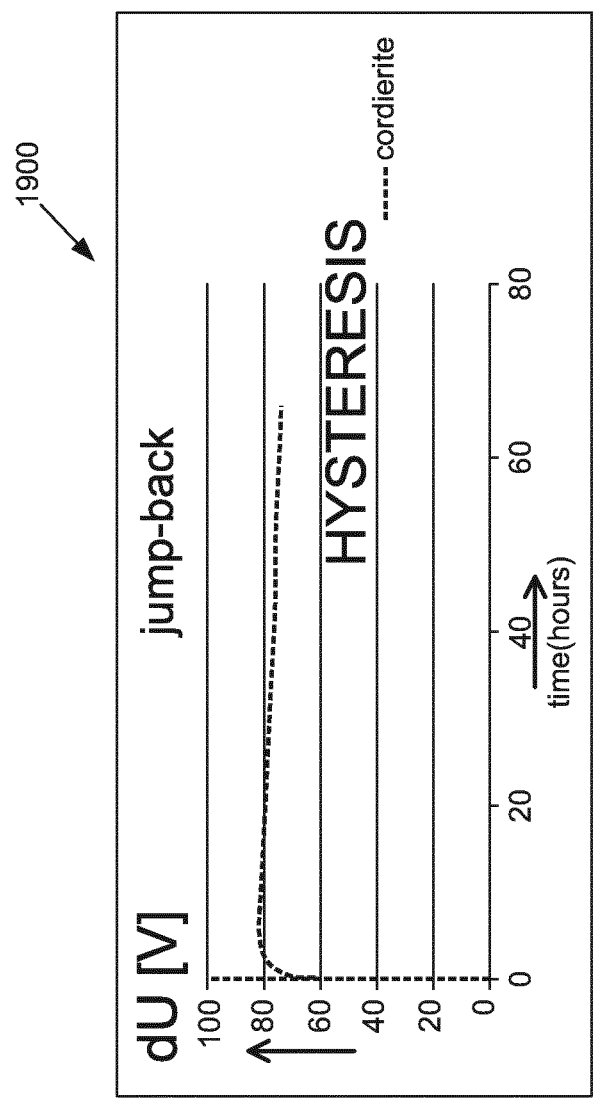
FIG. 19 is a plot illustrating the response of a cordierite layer to a voltage difference being applied to different surfaces of the cordierite layer.

FIG. 19 is a plot illustrating the response of a cordierite layer to a voltage difference being applied to different surfaces of the layer. As shown in FIG. 19, the cordierite layer exhibits hysteresis as the different surfaces maintain a voltage difference over time, thereby illustrating that cordierite has high electrical isolation properties.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may be made in this text to the use an electrostatic clamp in lithographic apparatus, it should be understood that the electrostatic clamp described herein may have other applications, such as for use in mask inspection apparatus, wafer inspection apparatus, aerial image metrology apparatus and more generally in any apparatus that measure or process an object such as a wafer (or other substrate) or mask (or other patterning device) either in vacuum or in ambient (non-vacuum) conditions, such as, for example in plasma etching apparatus or deposition apparatus.

The terms "radiation" and "beam" as used herein encompass all types of electromagnetic radiation, including ultraviolet (UV) radiation (e.g., having a wavelength of or about 365, 355, 248, 193, 157 or 126 nm) and extreme ultraviolet (EUV) radiation (e.g., having a wavelength in the range of 5-20 nm), as well as beams of charged particles, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way. The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
   an electrostatic clamp configured to releasably hold a reticle, the electrostatic clamp comprising:
      a first substrate having opposing first and second surfaces;
      a plurality of burls located on the first surface and configured to contact the reticle;
      a second substrate having:
         opposing first and second surfaces, and
         a thermal via, between the opposing first and second surfaces, having a thermally conductive material within the thermal via,
      wherein the first surface of the second substrate is coupled to the second surface of the first substrate; and
      a plurality of cooling elements located between the first surface of the second substrate and the second surface of the first substrate, wherein:
         the plurality of cooling elements is configured to cause electrons to travel from the second surface of the first substrate to the first surface of the second substrate; and
         the plurality of cooling elements are vertically aligned under corresponding burls.

2. The lithographic apparatus of claim 1, further comprising:
   a chuck coupled to the second surface of the second substrate, the chuck being configured to act as a heat sink for the plurality of cooling elements.

3. The lithographic apparatus of claim 2, wherein the chuck comprises a plurality of cooling channels configured to provide for coolant circulation therein.

4. The lithographic apparatus of claim 1, wherein:
   the plurality of cooling elements comprises either a plurality of thermo-tunneling cooling (TTC) elements or a plurality of thermoelectric cooling (TEC) elements; and
   each cooling element of the plurality of cooling elements is configured to cause a current to flow away from the second surface of the first substrate.

5. The lithographic apparatus of claim 4, wherein each TEC element of the plurality of TEC elements comprises a solder bump coupled to the first surface of the second substrate.

6. The lithographic apparatus of claim 5, wherein each TEC element of the plurality of TEC elements further comprises a post coupled to the second surface of the first substrate and is configured to mate with a respective solder bump.

7. The lithographic apparatus of claim 4, wherein the plurality of TEC elements are included in a thermoelectric film.

8. The lithographic apparatus of claim 4, wherein at least one of the first and second substrates comprises a substantially zero-thermal-expansion-material coated with a thermally conductive material.

9. The lithographic apparatus of claim 4, wherein each TTC element of the plurality of TTC elements comprises first and second metal plates, the first metal plate being coupled to the second surface of the first substrate and the second metal plate being coupled to the first surface of the second substrate.

10. The lithographic apparatus of claim 9, wherein each TTC element of the plurality of TTC elements further comprises a spacer located between the first and second plates and configured to maintain a distance between the first and second plates.

11. The lithographic apparatus of claim 1, further comprising a layer of silicon disposed on the first surface of the second substrate.

12. The lithographic apparatus of claim 1, wherein the electrostatic clamp comprises cordierite.

13. The lithographic apparatus of claim 1, further comprising:
   a controller configured to control a current flowing through each cooling element of the plurality of cooling elements.

14. The lithographic apparatus of claim 13, wherein the controller is configured to individually control each cooling element of the plurality of cooling elements.

15. An electrostatic clamp comprising:
   a first substrate having opposing first and second surfaces;
   a plurality of burls located on the first surface and configured to contact a reticle;
   a second substrate having:
      opposing first and second surfaces, and
      a thermal via, between the opposing first and second surfaces, having a thermally conductive material within the thermal via,
   wherein the first surface of the second substrate is coupled to the second surface of the first substrate; and
   a plurality of cooling elements located between the first surface of the second substrate and the second surface of the first substrate, wherein:
      the plurality of cooling elements is configured to conduct electrons from the second surface of the first substrate to the first surface of the second substrate; and
      the plurality of the cooling elements are vertically aligned under corresponding burls.

* * * * *